(12) United States Patent
Flanders

(10) Patent No.: US 6,594,058 B2
(45) Date of Patent: Jul. 15, 2003

(54) ROLLING SHUTTER OPTICAL SWITCH DEVICE WITH MIRROR ON SHUTTER AND OPEN APERTURE OPTICAL PORT

(75) Inventor: Dale C. Flanders, Lexintgon, MA (US)

(73) Assignee: Axsun Technologies, Inc., Billerica, MA (US)

( * ) Notice: Subject to any disclaimer, the term of this patent is extended or adjusted under 35 U.S.C. 154(b) by 51 days.

(21) Appl. No.: 09/800,062

(22) Filed: Mar. 5, 2001

(65) Prior Publication Data

US 2002/0003920 A1 Jan. 10, 2002

Related U.S. Application Data

(60) Provisional application No. 60/187,226, filed on Mar. 3, 2000, provisional application No. 60/188,119, filed on Mar. 9, 2000, and provisional application No. 60/220,355, filed on Jul. 24, 2000.

(51) Int. Cl.[7] ............................................. G02B 26/02
(52) U.S. Cl. ........................ 359/227; 359/224; 385/18; 385/16
(58) Field of Search .............................. 359/227, 230, 359/838, 846–848, 223, 224; 385/18, 16

(56) References Cited

U.S. PATENT DOCUMENTS

| 5,233,459 A | 8/1993 | Bozler et al. | 359/230 |
| 5,519,565 A | 5/1996 | Kalt et al. | 361/280 |
| 5,774,604 A | 6/1998 | McDonald | 385/18 |
| 5,781,331 A | 7/1998 | Carr et al. | 359/288 |
| 5,960,132 A | 9/1999 | Lin | 385/18 |

Primary Examiner—James Phan
(74) Attorney, Agent, or Firm—Samuels, Gauthier & Stevens, LLP (57) ABSTRACT

An optical switch device includes a rolling shutter or membrane attached at one of its edges to a substrate near an optical port in the substrate. The rolling shutter can assume one of two states. In a first closed state, the membrane is uncoiled onto the substrate over the port such that light directed at the port impinges on the shutter. In a second open state, the membrane is rolled up away from the port such that light directed at the port impinges on the port. In one embodiment, a mirror is formed on the membrane such that when the membrane is in the closed state over the substrate, light directed at the port is reflected by the mirror. In one configuration, the optical port includes a hole or aperture such light passed through the port without interference. The device can include a latch electrode the far end of the membrane such that when it is rolled out, it can be held in position by a latching voltage applied across the latch electrode and the substrate. Slits can be formed in the membrane to keep the mirror flat by relieving strain in the membrane and to allow gases in proximity to the device to pass through the membrane as it is activated. The shutter can include dimples to minimize the area of contact between the membrane and the substrate to reduce the probability of the two sticking together. The attachment edge of the membrane can be made shorter than its width to reduce distortions in the membrane to keep the mirror flat. A raised annular rim can be provided around the port such that when the shutter is held down over the port it is pulled taut and flat over the rim. This feature is also used to maintain flatness in the mirror. The switch device can be used as part of an array of optical switches.

16 Claims, 12 Drawing Sheets

ROLLING SHUTTER OPTICAL SWITCH DEVICE WITH MIRROR ON SHUTTER AND OPEN APERTURE OPTICAL PORT

RELATED APPLICATIONS

This application is based on U.S. provisional patent application Ser. No. 60/187,226, filed on Mar. 3, 2000; U.S. provisional patent application Ser. No. 60/188,119, filed on Mar. 9, 2000; and U.S. provisional patent application Ser. No. 60/220,355, filed on Jul. 24, 2000.

FIELD OF THE INVENTION

The present invention relates to an improved optical switch device with a rolling shutter in which, when the shutter is in an open position, light passes impinges on a substrate of the device, and when the shutter is in a closed position, light is reflected back by the shutter.

BACKGROUND OF THE INVENTION

Optical switch devices have been developed in which a movable shutter is mounted on a smooth flat substrate. The shutter is positioned such that light is directed toward the substrate in proximity to the shutter. The shutter is made of a thin material which has stresses introduced such that the shutter is normally in a coiled configuration. As a result, light directed onto the substrate is able to pass through the substrate without obstruction from the shutter. When a voltage is applied across the substrate and the shutter, the resulting electric field causes the shutter to uncoil into a flat position over the surface of the substrate. Light directed onto the substrate therefore impinges on the uncoiled shutter. Such a device can be implemented in a variety of optical switching applications.

For example, U.S. Pat. No. 5,233,459, issued on Aug. 3, 1993, entitled "Electric Display Device," describes an optical switch device with a movable shutter. The shutter is formed on a glass substrate such that when the shutter is coiled up, light can pass freely through the device. When the shutter is uncoiled, it is held in a relatively flat state over the substrate by the electric field applied between the shutter and the substrate. In this state, light impinges of the shutter.

Such devices are prone to several drawbacks. For example, the shutter can have a tendency to stick to the substrate. When the electric field is removed or reduced, the sticking interferes with the ability of the shutter to recoil. This can cause substantial delays in devices and processes which utilize the device, or can result in complete failure of the devices and processes. Also, the gaseous atmosphere in which the device operates can slow the opening and closing of the shutter, also resulting in delayed processing. Also, the shutter can tend to distort when it is uncoiled.

SUMMARY OF THE INVENTION

The present invention is directed to an improved optical switch device or element, an array of optical switch devices or elements and an optical switching method. The optical switch device of the invention includes a substrate and a flexible membrane or shutter attached at one of its ends to a surface of the substrate. The substrate includes an optical port portion on which light can be made to impinge. The flexible membrane is attached to the substrate in proximity to the optical port portion of the substrate. The flexible membrane is configured such that it is controllable between a first or closed state and a second or open state. In the closed state, the membrane is disposed onto the substrate over the optical port portion such that when light is directed toward the optical port portion of the substrate, the light impinges on the flexible membrane. In the open state, the membrane is disposed away from the optical port portion of the substrate such that when light is directed toward the optical port portion, it impinges on the optical port portion.

In one aspect of the invention, a reflective surface or mirror is formed on the flexible membrane. In this configuration, when the membrane is in the closed state, light is reflected by the mirror. In the open state, light is allowed to impinge on the optical port portion of the substrate.

The flexible membrane or shutter is configured such that it is normally in the open state. When the membrane is fabricated, stresses are introduced into the material such that in a quiescent state, the membrane is rolled up into a coiled configuration. When the membrane is attached to the substrate, and a programming or operating voltage is applied across the membrane and the substrate, the resulting electric field causes the membrane to uncoil and lay over the optical port portion of the substrate. Generally, as long as the voltage is applied, the membrane is held in the uncoiled closed state. When the voltage is removed, the membrane coils back up into the open state.

In one aspect of the invention, an aperture or hole is formed through the substrate at the optical port portion of the substrate. In this configuration, when the membrane is in the open position, light directed at the optical port portion of the substrate passes through the aperture without obstruction. As in the general configuration set forth above, when the membrane is in the closed position, the light impinges on the membrane.

In accordance with another aspect of the invention, the device includes a latching capability which allows the membrane to be held in the closed, i.e., uncoiled, state without maintaining the operating voltage applied across the substrate and the entire membrane. The device can be provided with a latch electrode formed on the substrate at the end of the membrane opposite the attachment end when the membrane is uncoiled. When the membrane is uncoiled, the end of the membrane is brought into close proximity to the latch electrode on the substrate. After the membrane uncoils into the closed position by application of the operating voltage, a latching voltage is applied across the latch electrode and the membrane. The resulting electric field in the air gap between the end of the membrane and the substrate holds the membrane in the uncoiled state. The operating voltage can then be removed. Since an electric field only exists where there is no contact between the membrane and the substrate, sticking of the membrane to the substrate is reduced or eliminated.

This latching feature provides several advantages. The latch feature substantially relieves degraded performance or failure of devices caused by sticking of the membrane to the substrate. Without the latching feature, the operating voltage would be maintained across the entire membrane and the substrate to keep the entire membrane in contact with the substrate as long as the switch remained in the closed state, in some cases for long periods of time. In such cases, the membrane often sticks to the substrate, resulting in significant degradation in performance or complete failure of the device. Because in the present invention, the membrane is maintained in the closed position by electric field in the air gap between the membrane and the substrate only the latch electrode, the probability of sticking is virtually eliminated.

In another aspect of the invention, the membrane is provided with a plurality of slits. The slits relieve strain in the membrane and prevent distortion of the membrane when it is pulled down over the substrate. The reduced or eliminated distortion allows the reflective surface on the membrane to be maintained extremely flat, resulting in greatly improved performance.

Another set of slits can be provided to enhance the switching performance of the device. Because the device of the invention operates in a gaseous atmosphere, atmospheric effects can slow the operation of the device. This second set of slits is provided to allow the gaseous atmosphere to pass through the membrane as it moves, i.e., as it transitions between states. Because the slowing effects of the atmosphere are greatly reduced by these gas venting slits, the device can change states faster, resulting in improved speed and performance.

In another aspect of the invention, the membrane is provided with a plurality of dimples, also to reduce sticking of the membrane to the substrate when the operating voltage is removed to transition the switch device from the closed state to the open state. The dimples provide much smaller points of contact between the membrane and the substrate. Holes can be additionally fabricated in the electrodes in the area around the dimples. This has the effect of reducing the electric field in the area of the dimple. As a result, the probability of the membrane sticking to the substrate is substantially reduced.

In another aspect of the invention, a raised annular rim is provided around the optical port portion of the substrate. When the membrane is uncoiled over the optical port, the area of the membrane near the port contacts the rim. The has the effect of flattening the membrane which improves performance of the device when the reflective surface is attached to the top of the membrane.

In another aspect of the invention, another approach is employed to flatten the membrane and/or mirror. The attachment edge of the membrane, i.e., the edge of the membrane at which the membrane is attached to the substrate, is made shorter than the rest of the width of the membrane by forming the membrane with a tapered shape. This has the effect of reducing distortions in the membrane and thereby allows the membrane to lay flat when it is held in the uncoiled or closed position.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention is directed to an improved optical switch device with a rolling thin membrane or shutter which closes and opens upon application and removal of an electric field. For example, the present application provides improvements over devices of the type described in U.S. Pat. No. 5,233,459 (the '459 patent hereinafter). That patent is incorporated herein in its entirety by reference. Throughout the following detailed description, elements of the device or methods used in fabricating the device of the invention are of the type described in the '459 patent, unless what is being described is different than or an improvement over an element, device or method of fabrication described in the '459 patent.

Figure 1A:
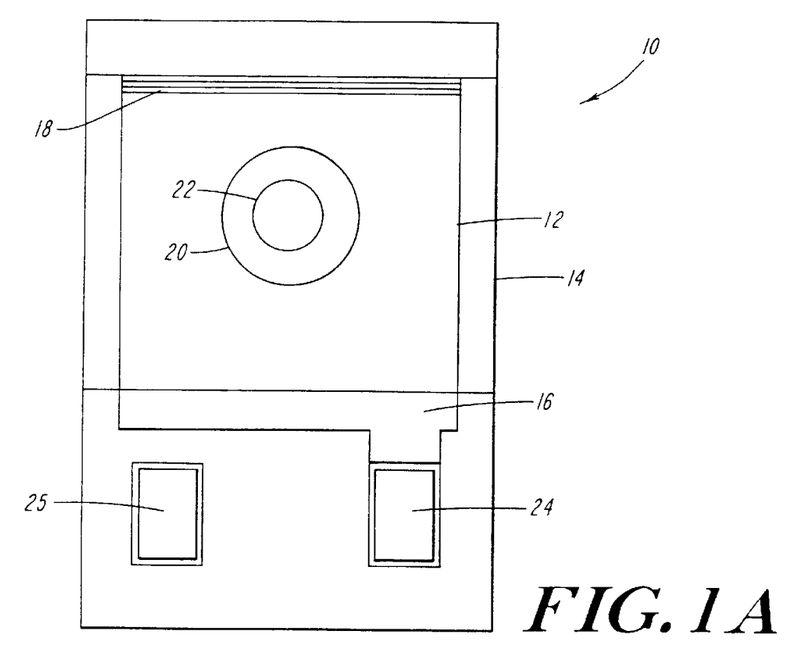
FIG. 1A contains an image of a single rolling membrane optical switch element with the element in the closed or uncoiled state, in accordance with one embodiment of the present invention.
Figure 1B:
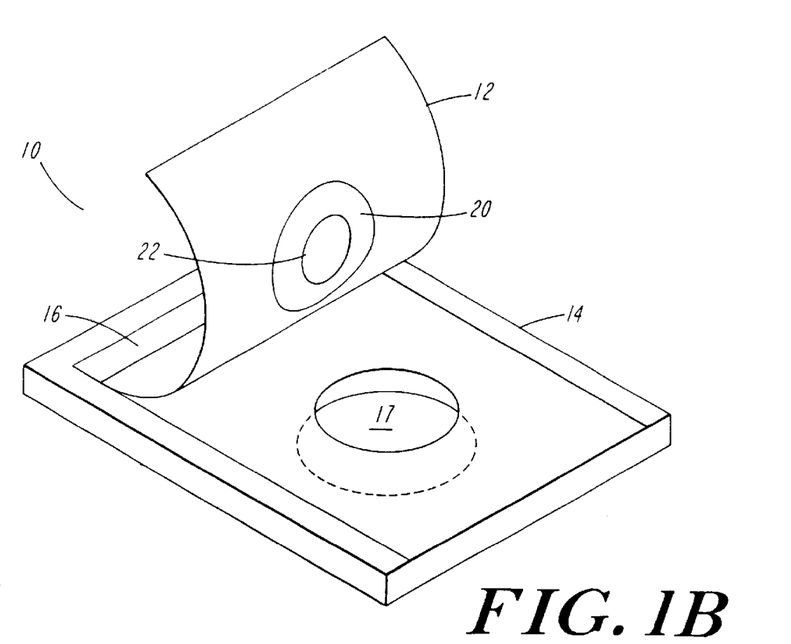
FIG. 1B contains a schematic perspective image of the switch element of FIG. 1B with the membrane in the open or coiled state.

FIG. 1A contains a top view image of a single MEMS rolling membrane optical switch element 10 in accordance with one embodiment of the present invention, with the membrane in the closed or uncoiled state, and FIG 1B contains a schematic perspective view of the switch element 10 with the membrane in the open or coiled state. The switch element 10 includes a rolling membrane or shutter or shade 12 which is attached at its attachment end 16 to a substrate 14. The membrane 12 includes corrugations 18 to aid in the coiling and uncoiling of the membrane 12. A membrane contact pad 24 is formed on the surface of the device 10 in electrical contact with the membrane. A substrate electrode 25 is formed in contact with the substrate 14. When the operating voltage is applied across the two electrodes 24 and 25, the membrane 12 uncoils over the substrate 14 into the configuration illustrated in FIG. 1. When the operating voltage is removed, the membrane 12 coils up away from the substrate 14 back to the position of FIG. 1B.

A double-sided reflective surface or mirror 22 is formed in the membrane 12 near its center such that reflective surfaces are exposed on both the top and bottom sides of the membrane. The mirror 22 is surrounded by circular corrugations 20 formed in the membrane to allow the mirror 22 to be easily coiled and uncoiled and to allow the mirror 22 to lay flat over the optical port in the substrate 12 when the membrane 12 is uncoiled onto the substrate 14.

In the invention described herein, the improvements made over prior devices, such as those described in the '459 patent, include rendering the substrate 14 highly transmissive and the movable membrane 12 highly reflective. As a result, when the membrane is open, i.e., coiled up, a light beam will pass through the substrate substantially unattenuated and unaberrated. When the shutter is closed, the light is reflected by the mirror.

Figure 2A:
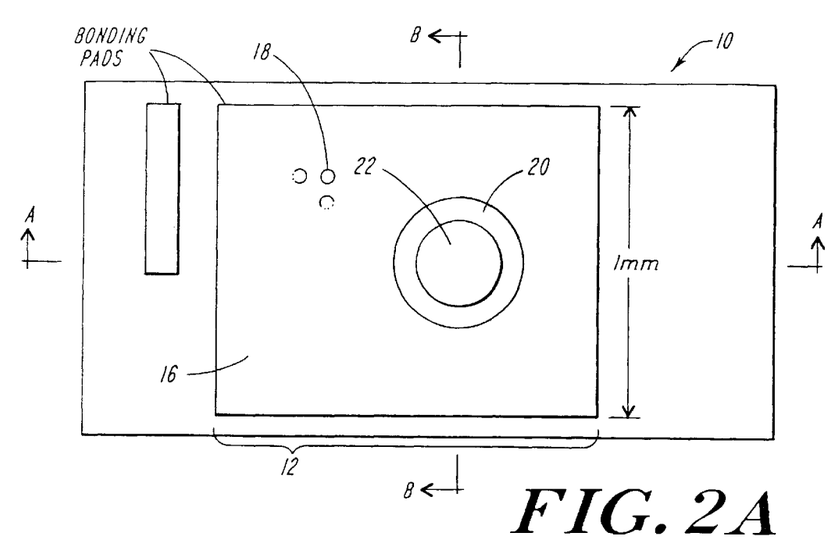
FIGS. 2A–2C contain schematic views of a rolling membrane optical switch device in accordance with an embodiment of the present invention.
Figure 2B:
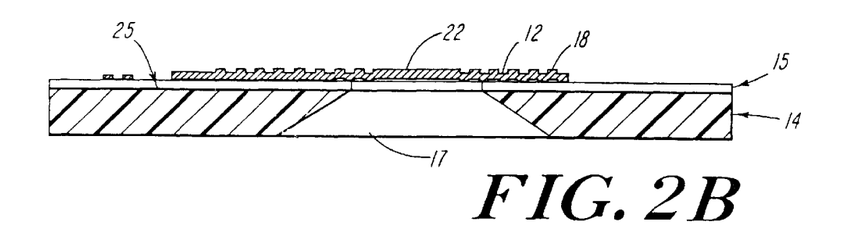
Figure 2C:
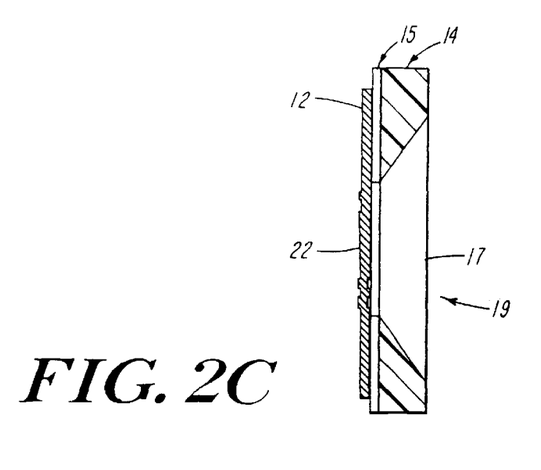

FIG. 2A is a top plan view of one embodiment of the rolling mirror optical switch element 10 of the invention. FIG. 2B is a schematic cross-sectional view of the rolling mirror optical switch element 10 of the invention taken along line A—A of FIG. 2A. FIG. 2C is a schematic cross-sectional view of the rolling mirror optical switch element 10 of the invention taken along line B—B of FIG. 2A. As shown in FIGS. 2A–2C, the membrane 12 opens and closes over an optical port portion 19 of the substrate 14. The substrate 14 can be made of a semiconductor material such as silicon and it has formed on its surface an insulating layer 15. The membrane 12 is attached to the top of the insulating layer 15.

Figure 3:
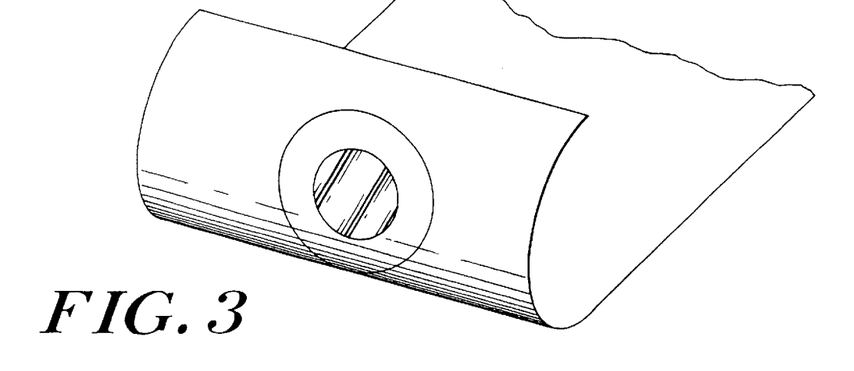
FIG. 3 contains an image of a rolling membrane optical switch device with the membrane in the open or coiled state, in accordance with one embodiment of the present invention.

In the embodiment of FIGS. 2A–2C, the switch element 10 is fabricated on a silicon wafer. A hole 17 is etched through the back of the substrate 14 so that light passes through the device substantially unobstructed. When the shutter 12 is closed, i.e., rolled out, the reflective portion 22 spans the aperture 17 and reflects the light. FIG. 3 contains an image of a rolling membrane optical switch device with the membrane in the open or coiled state, in accordance with one embodiment of the present invention. In this embodiment, the reflective portion in the middle of the membrane is formed to have tensile stress which will tend to apply stretching to the mirror to keep the mirror flat. The mirror section of the membrane is designed to be under tensile stress so that it is stretched flat like a drumhead. The mirror part of the shutter is also thinner and more flexible than the other areas of the shutter so that the forces stretching out the drumhead are small enough to not easily distort the shutter. Also, the circular corrugations 20 outside the mirror area 22 further relieve the forces on the rest of the shutter membrane.

In another embodiment, the substrate is made thin such that it is substantially transparent at the wavelength of interest. Such a wafer provides substantially unobstructed transmission when the shutter 12 is open and provides support for the shutter when it is closed. In this embodiment, the wafer can be composed of an optically transparent but electrically semiconducting material such that the actuation or operating voltage is applied through or partially through the wafer.

Figures 4A, 4B, 4C:
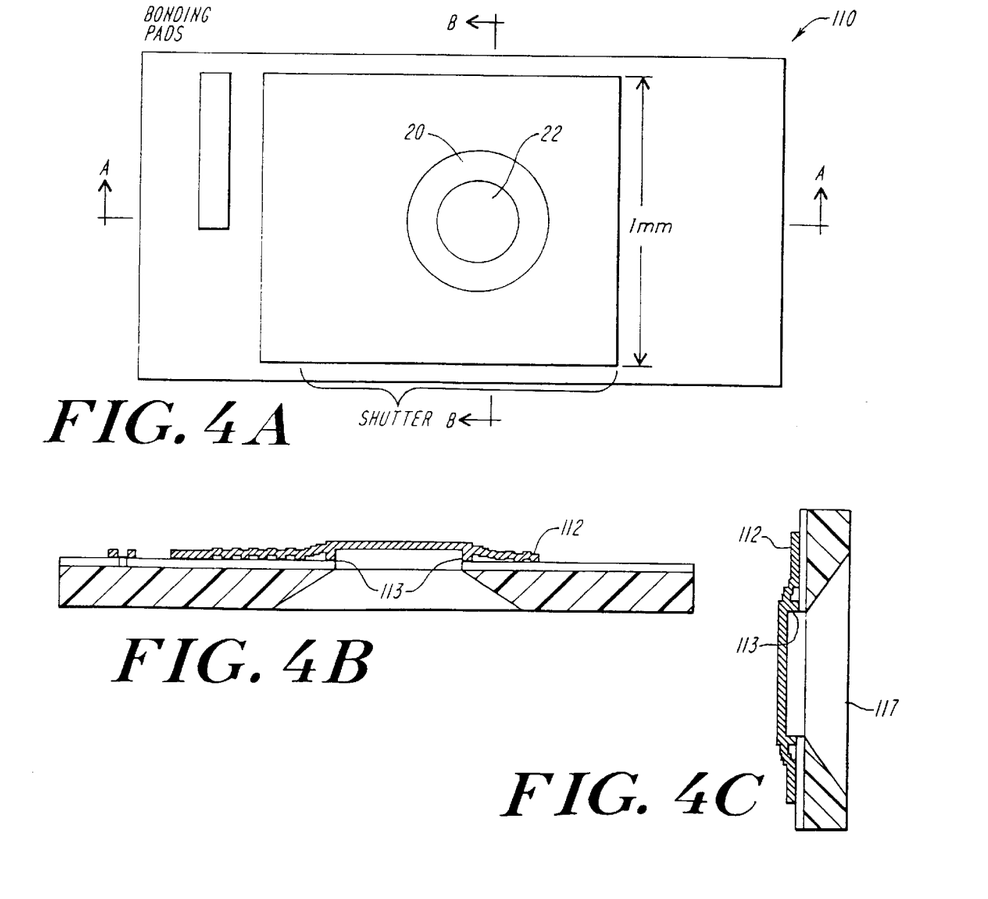
FIGS. 4A–4C contain schematic views of a rolling membrane optical switch device with a raised annular rim around the optical port, in accordance with one embodiment of the present invention.

FIG. 4A is a top plan view of another embodiment of the rolling mirror optical switch element 110 of the invention with the membrane in the closed or uncoiled position. FIG. 4B is a schematic cross-sectional view of the rolling mirror optical switch element 110 of the invention taken along line A—A of FIG. 4A. FIG. 4C is a schematic cross-sectional view of the rolling mirror optical switch element 110 of the invention taken along line B—B of FIG. 4A.

In this embodiment and the other embodiments described herein, the shutter can be less than 1 micron thick and can be up to 1,000 microns across. The mirror can be approximately 400 microns across. The mirror 22 preferably comprises a reflective metal such as gold, aluminum or a gold/aluminum bilayer. Alternatively, thin film dielectric mirror coatings can be used. The stiffness in the membrane and mirror is low; the membrane and mirror are not rigid enough in general to assure a flat reflective surface. The flatness typically required in settings in which the device of the invention is applicable, such as fiber optic laser communications applications, is about 1000 Angstroms or less. In fact, it is this lack of rigidity which allows the mirror to be rolled and unrolled. The substrate, which is made of silicon, can have a flat enough surface. When the shutter lies in intimate contact with the substrate, the shutter will also be flat enough. In one embodiment, the mirror is flat to within 1,000 Angstroms. In one embodiment, the substrate is thinned in the region of the mirror to the point where it becomes transparent to the wavelength, e.g., infrared, of interest, allowing the substrate to provide support for the mirror when the membrane is unrolled and to act as a window for the transmitted beam when the membrane is rolled. An antireflection coating is used if the substrate is used as a window.

As noted above, in another embodiment, the substrate includes a tapered hole or aperture 117 in the substrate under the membrane. The hole cannot provide support for the mirror to keep it flat. The mirror is made flat by pulling it taut over the raised annular rim structure 113 formed on the surface of the insulating layer 15 around the opening of the aperture 117.

In some cases it is desirable to use materials in the shutter membrane that have a different coefficient of expansion than the substrate and sometimes the fabrication process requires that there is a net strain in the membrane relative to the substrate. This strain can cause buckling or distortion in the membrane, which can have a marked effect on the actuation of the shutter and could reduce the mirror flatness. To overcome these problems, the present invention provides an improved membrane.

Figure 5A:
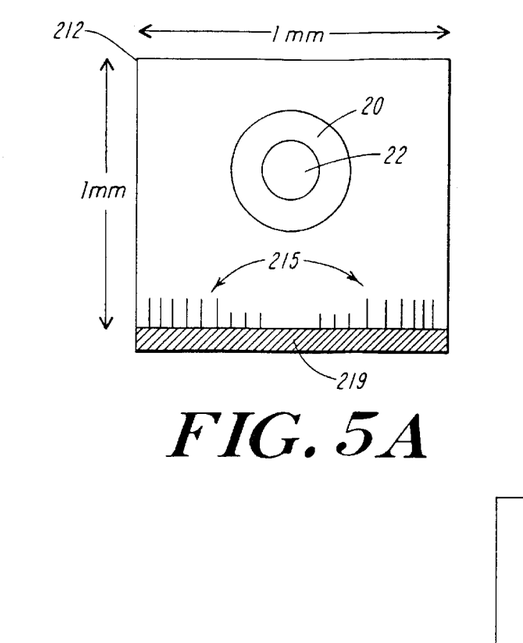
FIG. 5A contains a schematic view of a rolling membrane optical switch device with strain relief slits formed in the flexible membrane, in accordance with one embodiment of the present invention.

FIG. 5A contains a schematic top view of a rolling membrane for an optical switch device with strain relief slits 215 formed in the flexible membrane, in accordance with one embodiment of the present invention. The strain relief slits 215 are provided in the membrane 212 as shown along the attachment edge of the membrane near attachment pads 219.

Figure 5B:
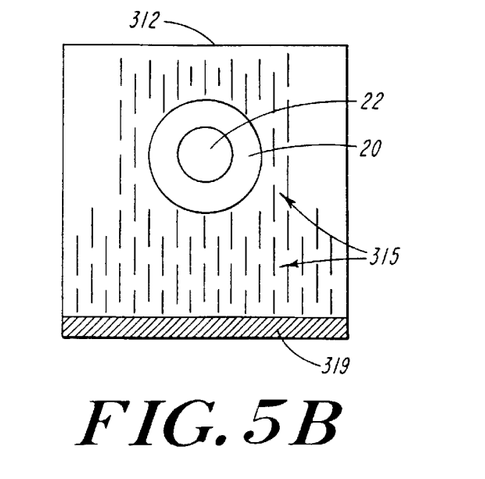
FIG. 5B contains a schematic view of a rolling membrane optical switch device with gas venting and strain relief slits formed in the flexible membrane, in accordance with one embodiment of the present invention.

FIG. 5B contains a schematic top view of a rolling membrane 312 for an optical switch device with gas venting and strain relief slits 315 formed in the flexible membrane, in accordance with one embodiment of the present invention. In addition to the strain relief benefit, these slits 315 also provide openings for the gas in the area of the device to move through the slits when the shutter is actuated. Since the shutter rolls out in a millisecond or less, the atmosphere around the shutter is pushed by the shutter, resisting its motion. Without the slits 315, this resistance is large enough to cause the shutter to bend during actuation, since the resistance force is larger in the center than the edge. The slits 315 relieve the gas pressure and help make the force more uniform, which improves the dynamic stability.

Figure 5C:
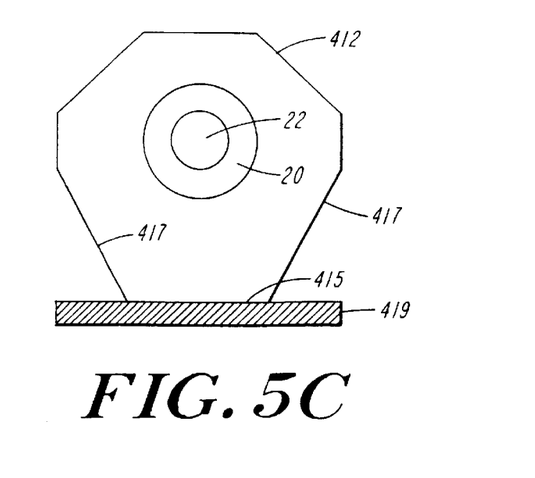
FIG. 5C contains a schematic view of a rolling membrane optical switch device with tapered membrane and a shortened membrane attachment edge, in accordance with one embodiment of the present invention.

FIG. 5C contains a schematic view of a rolling membrane 412 for an optical switch device with a tapered membrane 412 and a shortened membrane attachment edge 415, in accordance with one embodiment of the present invention. The side edges include tapered sections 417 such that the attachment edge 415 at the attachment pad 419 is shorter than the maximum width of the membrane 412.

Figure 6A:
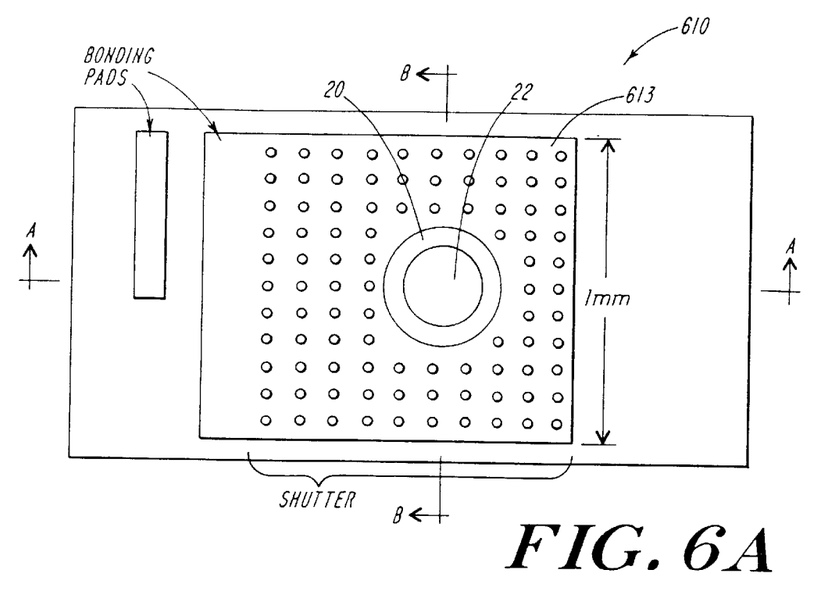
FIGS. 6A–6C contain schematic views of a rolling membrane optical switch device with dimples formed in the membrane, in accordance with one embodiment of the present invention.
Figure 6B:
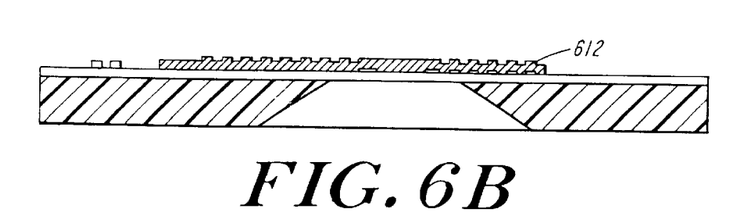
Figure 6C:
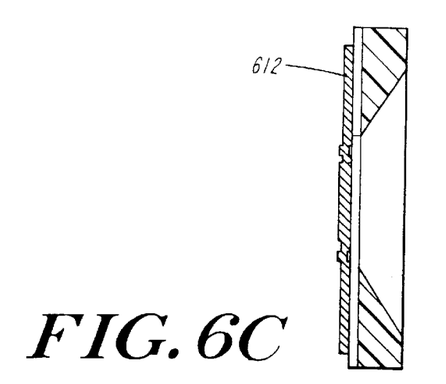

An additional improvement provided in accordance with the invention is reduced sticking between the shutter membrane and the substrate. Sticking is an important issue because it can cause a catastrophic failure of the shutter device. One of the causes for sticking is the high electric field between the shutter membrane and the pull down electrode in the substrate. Fields on the order of one million volts per centimeter are common for these shutter devices. Electric breakdown and charge migration are expected to occur at these field strengths and can cause sticking. In accordance with the invention, the membrane is modified to reduce the probability of sticking. FIGS. 6A–6C contain schematic views of a rolling membrane optical switch device 610 with dimples formed in the membrane 612, in accordance with one embodiment of the present invention. FIG. 6A is a top plan view of this embodiment of the rolling mirror optical switch element 610 of the invention with the membrane 612 in the closed or uncoiled position. FIG. 6B is a schematic cross-sectional view of the rolling mirror optical switch element 610 of the invention taken along line A—A of FIG. 6A. FIG. 6C is a schematic cross-sectional view of the rolling mirror optical switch element 610 of the invention taken along line B—B of FIG. 6A.

In the embodiment of FIGS. 6A–6C, the membrane 612 includes an array of dimples 613. In contrast with prior structures in which both the substrate pull-down electrode and the membrane electrode are continuous sheets of metal, in this configuration of the invention, the dimples are fabricated with holes in one or both of the electrodes in the area of and immediately surrounding the dimples 613. This removal of electrode material has the effect of greatly reducing the field in the area of the dimple, which, in turn, greatly reduces the probability of sticking.

Figure 7A:
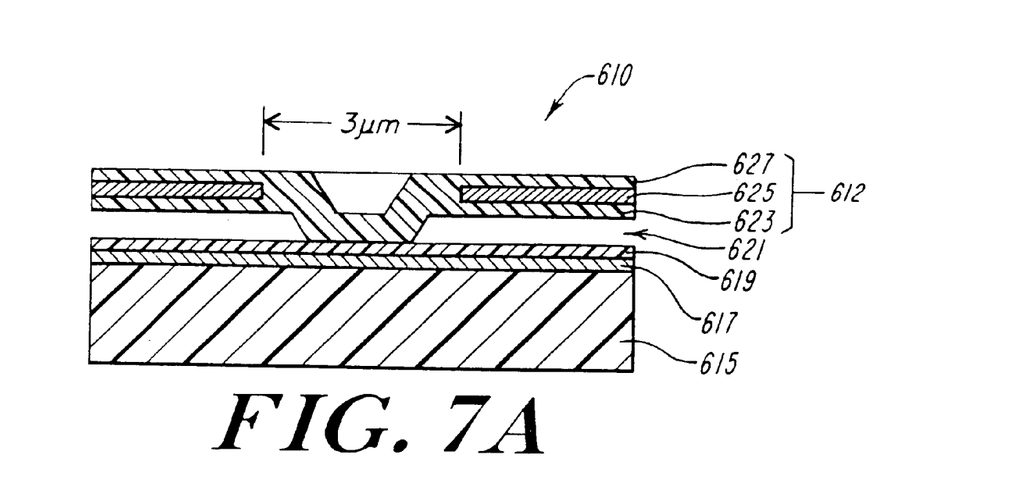
FIGS. 7A–7B contain schematic cross-sectional views of the rolling membrane optical switch device of FIGS. 6A–6C with dimples formed in the membrane, in accordance with one embodiment of the present invention.
Figure 7B:
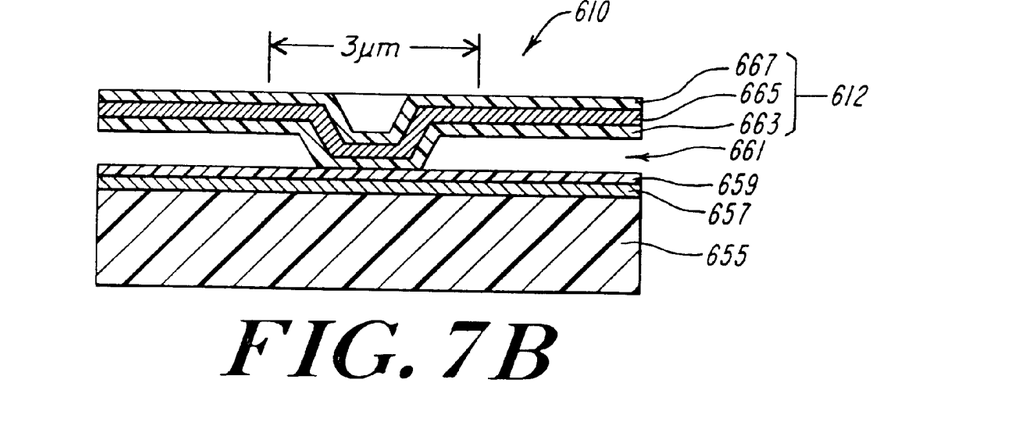

FIGS. 7A–7B contain detailed schematic cross-sectional views of alternate embodiments of the dimples 613 formed on the rolling membrane 612 of the optical switch device of FIGS. 6A–6C. As shown in FIG. 7A, the device 610 is formed on a substrate 615. A metal layer 617 is formed on the substrate 615, and a silicon dioxide layer 619 is formed on the metal layer 617 to a thickness of about 1,000 angstroms. A 3,000 angstrom gap is left between the lower body of the device 610 and the membrane 610. The membrane is made from three layers of material, including a 1,000 angstrom thick silicon dioxide layer 623, a 1,000 angstrom thick aluminum layer 625 and another 1,000 angstrom thick silicon dioxide layer 627. The membrane 612 in the area of the dimple 613 is shaped to create the dimple 613 to a width of about 3 microns. The dimple of FIG. 7B includes the same types of layers as that of FIG. 7A. That is, the structure of FIG. 7B also includes a substrate 655, a metal layer 657, a 1,000 angstrom silicon dioxide layer 659, a 3,000 angstrom gap 661, and a three-layer membrane 612, which includes two 1,000 angstrom silicon dioxide layers 663 and 667 with a 1,000 angstrom aluminum layer between them.

The difference between the structures of FIGS. 7A and 7B is in the shapes of the layers. For example, in the device of FIG. 7A, the aluminum layer 625 is interrupted in the area of the dimple. Also, in FIG. 7B, in the area of the dimple, the metal layer 657 is interrupted.

Figure 8A:
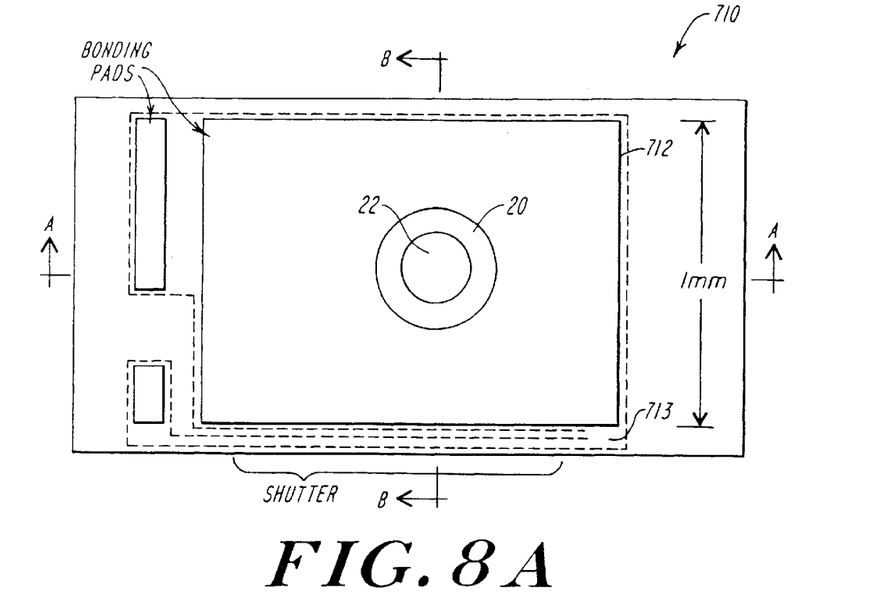
FIGS. 8A–8C contain schematic views of a rolling membrane optical switch device with latch electrode, in accordance with one embodiment of the present invention.
Figure 8B:
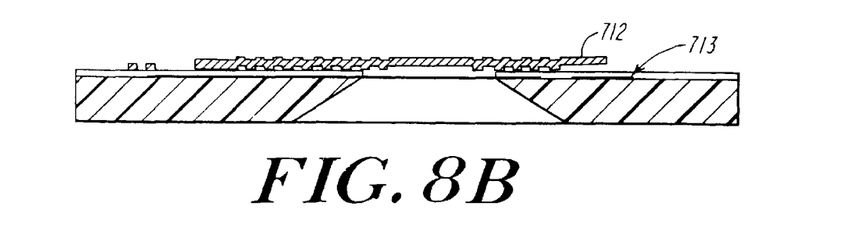
Figure 8C:
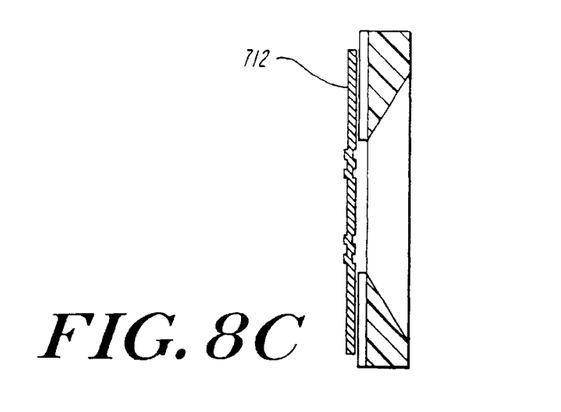

In accordance with the invention, another approach to preventing sticking between the membrane and the substrate includes the addition of a secondary, latching electrode, as shown in FIGS. 8A–8C, which contain schematic views of a rolling membrane optical switch device 710 with a latch electrode 712, in accordance with one embodiment of the present invention. FIG. 8A is a top plan view of this embodiment of the rolling mirror optical switch element 670 of the invention with the membrane 712 in the closed or uncoiled position. FIG. 8B is a schematic cross-sectional view of the rolling mirror optical switch element 710 of the invention taken along line A–A of FIG. 8A. FIG. 8C is a schematic cross-sectional view of the rolling mirror optical switch element 710 of the invention taken along line B—B of FIG. 8A.

The latch electrode 713 provides several functions. First, the extra electrode 713 provides an electric field within an air gap between the end of the membrane and the substrate at the far end of the rolled out membrane 712 to hold down the shutter 712 once rollout has been accomplished. The intensity of the electric field is selected such that the end of the membrane is not pulled down into contact with the substrate, as shown in FIG. 8B. With this field in place, the rollout or operating voltage in regions where the membrane is in contact with the substrate, which must be under the body of the membrane 712 to be effective, can be turned off. Thus, except for the brief initial pulse to initiate and roll out the membrane 712, the field is eliminated in the region of contact between the membrane 712 and the substrate, thereby reducing the potential for sticking. In one embodiment, the part of the membrane 712 over the latch electrode is physically held off the substrate surface by added support structures.

A second feature of this latching capability of the invention is a simplified drive circuit for use with the latching electrode. Because the latching electrode is separately accessible, the drive signals can each be simple, binary-switched signals rather than high-to-low ramps. A third feature of the latching electrode switch invention is the use of row/column address lines instead of individual address lines. That is, in a switch array such as the type described below, the (M,N)th switch can be activated by energizing the Mth row of membrane electrodes and the Nth column of pull-down electrodes and latching electrodes. Once the (M,N)th switch is latched, the power can then be removed from the pull-down electrode, and the latching voltage can be applied to the Mth row of membrane electrodes and the Nth row of latching electrodes.

Figure 9A:
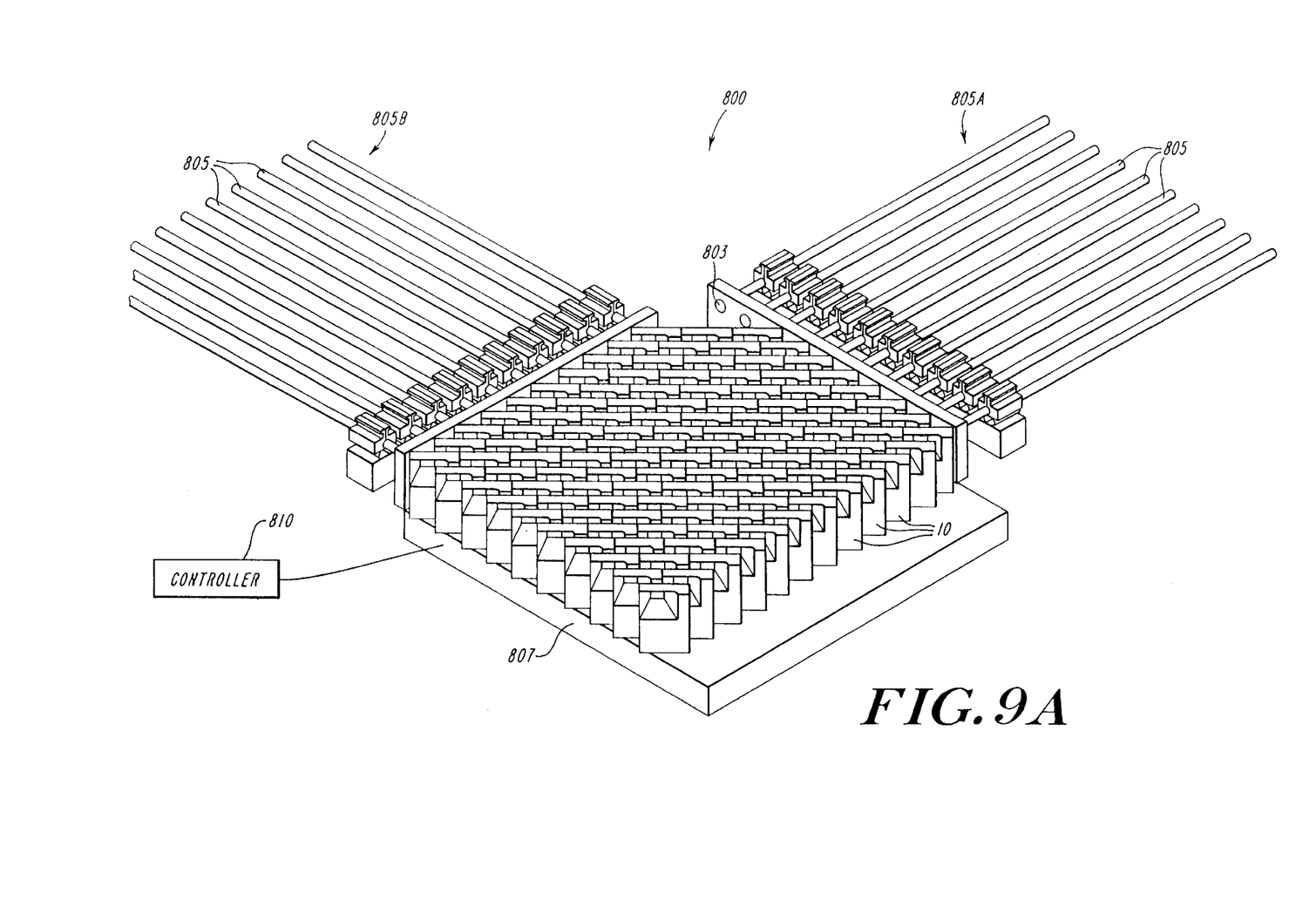
FIG. 9A contains a schematic perspective view of an optical switch array, in accordance with an embodiment of the present invention.
Figure 9B:
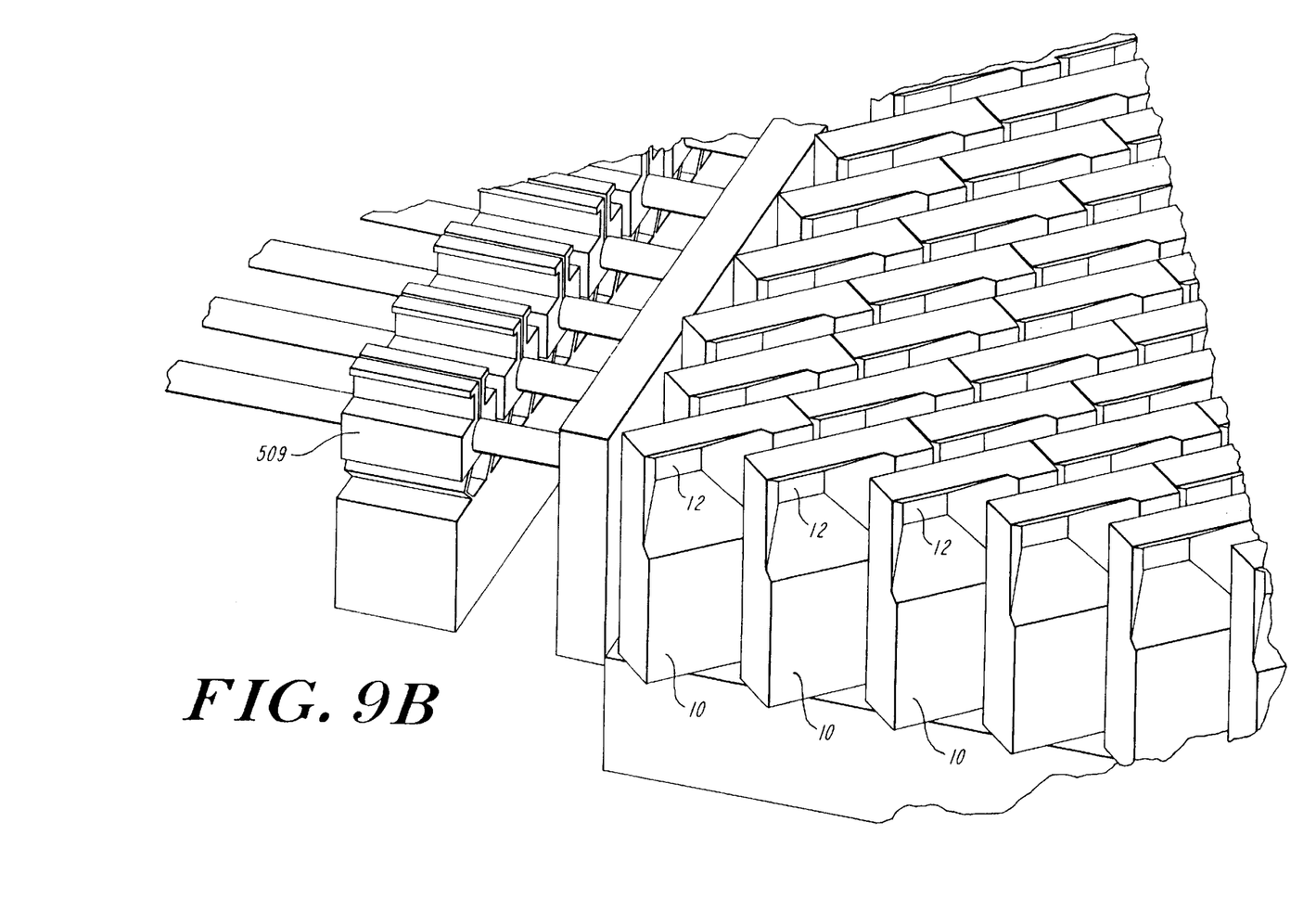
FIG. 9B contains a detailed close-up schematic perspective view of a portion of the optical switch array of FIG. 9A.

In another aspect, the invention is directed to an N×M optical switch array for use in optical data and telecommunications applications. FIG. 9A contains a schematic perspective view of an optical switch array 800, in accordance with an embodiment of the present invention, and FIG. 9B contains a detailed close-up schematic perspective view of a portion of the optical switch array 800 of FIG. 9A. The array 800 incorporates N times M copies of any version of the improved optical switch device 10 described herein fabricated using MEMS technology. The improvements in the device allow it to alternately reflect and transmit a free-space-propagating optical data signal. As shown in FIGS. 9A and 9B, the switch devices 10 are arranged on an N-by-M grid so that any of the M input signals can be routed arbitrarily to the N output ports by activating, i.e., making reflective, the device located at the (N,M)th grid location. The invention is also enabled by the use of special high quality microlenses 803 and a unique mounting approach for the various components.

As shown in FIGS. 9A and 9B, the array 800 selectively switches light between two orthogonal optical fiber arrays 805A and 805B. Light from each optical fiber 805 is collimated by a microlens 803 before it is launched into the N×M grid of switches 10. In this embodiment, each switch is one of the improved optical switch devices described herein. As described above, each switch element contains the thin membrane 12 that, because of internal stresses built in during fabrication, are normally curled up into a roll or coil. When the switch is rolled up, the collimated light from the fiber is allowed to pass through the hole at the switch grid location. By selectively applying a voltage between the membrane and the substrate of a selected switch, the respective membrane is uncurled or rolled out, revealing the reflective spot or mirror that will reflect the beam of light to the output port of the array 800. The reflective mirror is designed to have a surface that is curved when rolled up and flat when rolled out. The output ports of the array 800 are identical to the input ports. A controller 810 is interfaced to the array 800 for controlling the opening and closing of switches 10 at selected locations by selectively applying and removing the operating and/or latching voltage as described above to the appropriate rows and columns of the array 800.

As shown in FIGS. 9A and 9B, the switches 10 are arranged in a grid configuration and are supported on a microbench 807. The fibers 805 and microlenses 803 are supported by supports 509.

Figure 10:
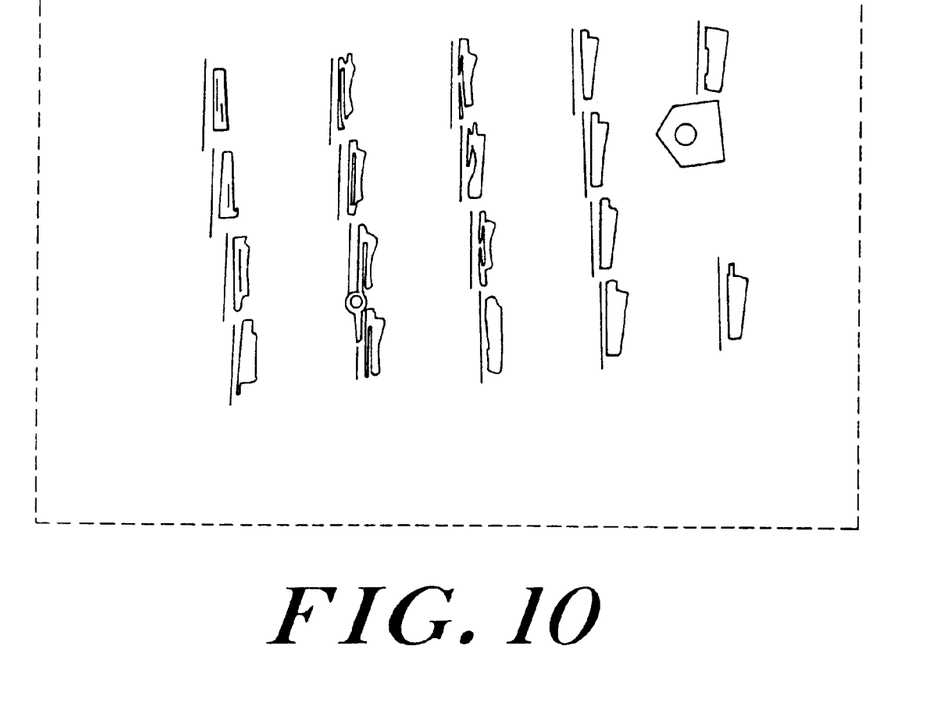
FIG. 10 contains an image of the optical switch array of the invention illustrating multiple optical switch elements in the open and closed states.

FIG. 10 contains an image of the optical switch array 800 he invention illustrating multiple optical switch elements 10 the open and closed states.

Figure 11:
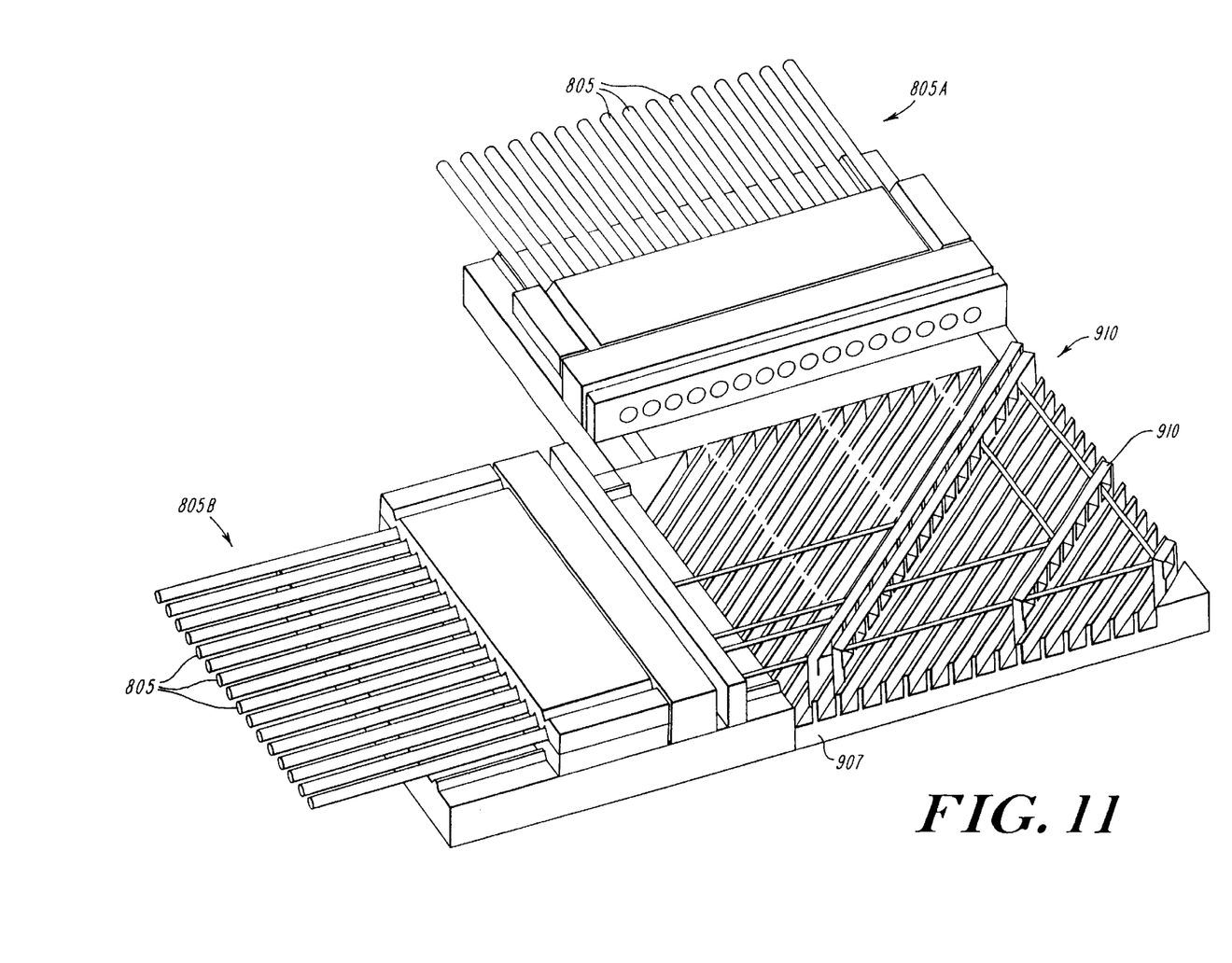
FIG. 11 contains a schematic perspective view of an optical switch array, in accordance with an embodiment of the present invention.

FIG. 11 contains a schematic perspective view of an optical switch array 900, prior to installation of all of the switch elements 10. It illustrates features of the approach to assembling the switch array 900 in accordance with an embodiment of the invention, as well as beam propagation through the matrix. As described in detail above, the switch elements 10 are fabricated lying down in the plane of the silicon wafer substrate and may be diced into linear arrays of any length, from one up to the number that fits across the width of the wafer. The individual die or linked linear arrays 910 are mounted on an optical microbench 907 "tombstone" style at the intersection of the path of a beam of light from one fiber 805 to another, as shown with only partial population in FIG. 11 for clarity and ease of illustration.

Figure 12:
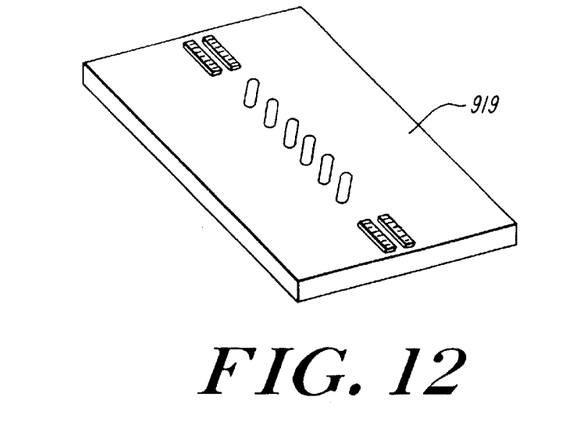
FIG. 12 contains an image of a switch element mounting structure used in an optical switch array, in accordance with an embodiment of the present invention.

The switches can be attached to the bench 907 in any of several ways. First, the switches can be mounted using purely passive alignment. Using this approach, the individual die or the linked dice are mounted directly into matching mounting structures machined into the optical bench 907. FIG. 12 contains an image of an example of such a mounting structure 919. The structure 919 includes a row of integral spring clips 921, each for holding one die.

Figure 13:
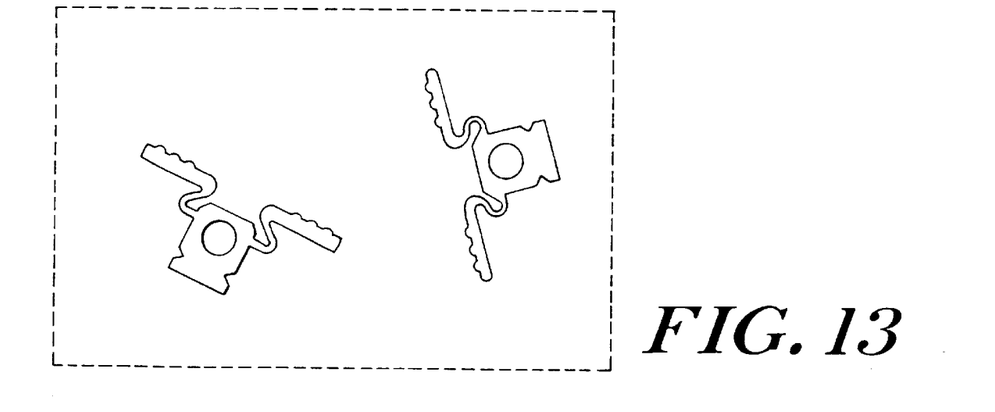
FIG. 13 contains an image of an alternative switch element mounting structure used in accordance with the invention.

Another mounting approach is shown in FIG. 13, which illustrates mounting and alignment structures (MAMS) described in a U.S. provisional patent application entitled, "Mounting and Alignment Structures for Optical Communications Components," Ser. No. 60/186,925, filed on Mar. 3, 2000 and a U.S. non-provisional patent application entitled, "Mounting and Alignment Structures for Optical Components," Ser. No. 09/648,348, filed on Aug. 25, 2000. Those applications are incorporated herein in their entirety by reference. Under this approach, the switches are placed on the MAMS by standard pack-and-place technology, as used in the semiconductor industry, and affixed using solder. The switch-bearing MAMS are similarly placed and affixed to the bench at the optical intersections between the input and output fiber ports. Only after the MAMS are soldered in place on the optical bench are they aligned using active alignment algorithms. A variation on this approach occurs when the MAMS are built in linear arrays. In this case, the individual switches are mounted on linear MAMS arrays of appropriate lengths, and then the array is mounted on the bench. Again, final alignment of each switch takes place using active alignment after mounting to the bench is complete.

Figure 14:
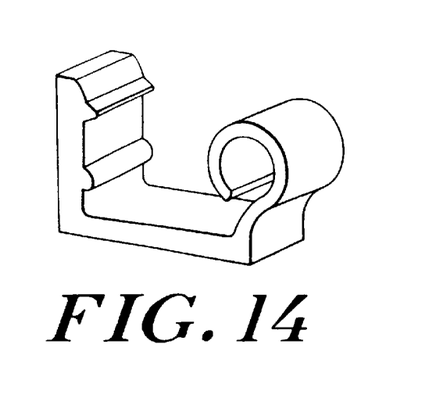
FIG. 14 contains an image of switch clips used in one embodiment of the mounting structure of FIG. 13, in accordance with an embodiment of the present invention.

A hybrid mounting approach is based on a spring clip MAMS, as shown in FIG. 14. For this approach, two spring clip MAMS are used to form the interface between the die/array and the microbench. Unlike the first approach, these MAMS are mounted and aligned passively, and then the switch dice are inserted. The electrical connections to the switch clips are made through traces on the optical bench. If the spring clip mount of FIG. 14 is used, then each spring arm carries the signal from the bench to the switch electrodes.

The interface between the optical fibers and the switch module is another important feature of the invention, since it allows the entire package to be made small, robust, and inexpensive. Referring again to FIG. 11, in one embodiment, an array of fiber collimators 911, arranged in a 90-degree corner with a second array of collimators, are used to transform light from similarly arranged rows of optical fiber to arrays of parallel beams of collimated light. These beams are deflected by the switches to the second lens array, which focuses the beams into the output fibers. This interface is created using linear arrays of MAMS to hold and align both the fibers and the collimating lenses. The collimating lenses are preferably manufactured by a patented mass transport process of the type described in U.S. Pat. No. 5,807,622, which is incorporated herein in its entirety by reference. However, other microlens fabrication techniques, such as binary optics or cast micro-refractive lenses, could also be used.

These lens and fiber arrays can be constructed from individual MAMS or from linearly connected arrays of MAMS. A feature of a MAMS is that it can be critically aligned using active feedback after it has been installed on the bench and after the lens or fiber has been installed on it.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. An optical switch device comprising:
   a bench;
   an input port on the bench;
   a first output port on the bench;
   a second output port on the bench;

a substrate connected to the bench;

a flexible membrane attached at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate from the input port impinges on a reflective surface of the flexible membrane and is reflected to the first output port, and, in a second state, the flexible membrane is disposed to expose the optical port portion of the substrate such that light directed toward the optical port portion of the substrate passes through an aperture formed through the optical port portion of the substrate to the second output port.

2. The optical switch device of claim 1, wherein the flexible membrane is formed such that in the second state, the flexible membrane is coiled away from the optical port portion of the substrate, and, in the first state, the flexible membrane is uncoiled over the aperture.

3. The optical switch device of claim 2, wherein the flexible membrane is normally in a coiled condition, and, upon application of an operating voltage across the substrate and the flexible membrane, the flexible membrane uncoils over the aperture.

4. An optical switching method comprising:

providing a bench;

providing an input port on the bench;

providing a first output port on the bench;

providing a second output port on the bench;

attaching a substrate to the bench;

attaching a flexible membrane at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate from the input port impinges on the flexible membrane and is reflected to the first output port and, in a second state, the flexible membrane is disposed to expose the optical port portion of the substrate such that light directed toward the optical port portion of the substrate from the input port passes through an aperture through the optical port portion of the substrate and is transmitted to the second output port.

5. The optical switching method of claim 4, wherein the flexible membrane is formed such that in the second state, the flexible membrane is coiled away from the optical port portion of the substrate, and, in the first state, the flexible membrane is uncoiled over the aperture.

6. The optical switching method of claim 5, wherein the flexible membrane is normally in a coiled condition, and, upon application of an operating voltage across the substrate and the flexible membrane, the flexible membrane uncoils over the aperture.

7. An optical switch device comprising:

a substrate;

a flexible membrane attached at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate impinges on the flexible membrane, and, in a second state, the flexible membrane is disposed to expose the optical port portion of the substrate such that light directed toward the optical port portion of the substrate impinges on the optical port portion of the substrate;

a reflective surface formed on the flexible membrane such that, when the flexible membrane is in the first state, light directed toward the optical port portion of the substrate is reflected by the reflective surface; and a plurality of slits formed in the flexible membrane such that distortions in the flexible membrane are reduced.

8. The optical switch device of claim 7, wherein the flexible membrane is formed such that in the second state, the flexible membrane is coiled away from the optical port portion of the substrate, and, in the first state, the flexible membrane is uncoiled over the optical port portion of the substrate.

9. The optical switch device of claim 8, wherein the flexible membrane is normally in a coiled condition, and, upon application of an operating voltage across the substrate and the flexible membrane, the flexible membrane uncoils over the optical port portion of the substrate.

10. The optical switch device of claim 7, further comprising a latch electrode at a second end of the flexible membrane, such that, when the flexible membrane is in the first state, upon application of a latching voltage between the latch electrode and the substrate, the flexible membrane is held in the first state.

11. An optical switch device comprising:

a substrate;

a flexible membrane attached at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate impinges on the flexible membrane, and, in a second state, the flexible membrane is disposed to expose the optical port portion of the substrate such that light directed toward the optical port portion of the substrate impinges on the optical port portion of the substrate;

a reflective surface formed on the flexible membrane such that, when the flexible membrane is in the first state, light directed toward the optical port portion of the substrate is reflected by the reflective surface; and a plurality of slits formed in the flexible membrane such that a gas in proximity to the optical switch device passes through the slits as the flexible membrane transitions between the first state and the second state.

12. An optical switching method comprising:

providing a substrate;

attaching a flexible membrane at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate impinges on the flexible membrane, and, in a second state, the flexible membrane is disposed to expose the optical port portion of the substrate such that light directed toward the optical port portion of the substrate impinges on the optical port portion of the substrate;

forming a reflective surface on the flexible membrane such that, when the flexible membrane is in the first state, light directed toward the optical port portion of the substrate is reflected by the reflective surface; and forming a plurality of slits in the flexible membrane such that distortions in the flexible membrane are reduced.

13. The optical switching method of claim 12, further comprising forming the flexible membrane such that in the second state, the flexible membrane is coiled away from the optical port portion of the substrate, and, in the first state, the flexible membrane is uncoiled over the optical port portion of the substrate.

14. The optical switching method of claim 13, further comprising forming the flexible membrane such that the flexible membrane is normally in a coiled condition, and, upon application of an operating voltage across the substrate and the flexible membrane, the flexible membrane uncoils over the optical port portion of the substrate.

15. The switching method device of claim 12, further comprising providing a latch electrode at a second end of the flexible membrane, such that, when the flexible membrane is in the first state, upon application of a latching voltage between the latch electrode and the substrate, the flexible membrane is held in the first state.

16. An optical switching method comprising:

providing a substrate;

attaching a flexible membrane at at least one end to a surface of the substrate in proximity to an optical port portion of the substrate, the flexible membrane being configured such that, in a first state, the flexible membrane is disposed over the optical port portion of the substrate such that light directed toward the optical port portion of the substrate impinges on the flexible membrane, and, in a second state, the flexible membrane is disposed to expose the optical port portion of the substrate such that light directed toward the optical port portion of the substrate impinges on the optical port portion of the substrate;

forming a reflective surface on the flexible membrane such that, when the flexible membrane is in the first state, light directed toward the optical port portion of the substrate is reflected by the reflective surface; and forming a plurality of slits in the flexible membrane such that a gas in proximity to the optical switch device passes through the slits as the flexible membrane transitions between the first state and the second state.

* * * * *